United States Patent
Roh

(10) Patent No.: US 7,026,633 B2
(45) Date of Patent: Apr. 11, 2006

(54) ION IMPLANTATION SYSTEM WITH AN INTERLOCK FUNCTION

(75) Inventor: Jin-Soo Roh, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 50 days.

(21) Appl. No.: 10/889,430

(22) Filed: Jul. 12, 2004

(65) Prior Publication Data

US 2005/0017199 A1    Jan. 27, 2005

(30) Foreign Application Priority Data

Jul. 22, 2003    (KR) .................... 10-2003-0050124

(51) Int. Cl.
*H01J 37/317* (2006.01)
(52) U.S. Cl. ................................. 250/492.21
(58) Field of Classification Search ........... 250/492.21, 250/492.2
See application file for complete search history.

(56) References Cited

U.S. PATENT DOCUMENTS 5,998,798 A * 12/1999 Halling et al. .......... 250/492.21

FOREIGN PATENT DOCUMENTS

KR    10-2000-21921 A    4/2000

* cited by examiner

*Primary Examiner*—Kiet T. Nguyen
(74) *Attorney, Agent, or Firm*—F. Chau & Associates, LLC

(57) ABSTRACT

An ion implantation system including a scan system for scanning an ion beam on a target wafer is provided. The ion implantation system includes a first control signal for controlling the scan system in a beam setup mode, and a second control signal for controlling the scan system in an ion implantation mode. A selection circuit selects one of the first control signal and the second control signal. A machine interface controls the selection circuit according to whether an ion implantation system is converted from the beam setup mode to the ion implantation mode. A detection device detects whether the machine interface satisfies a predetermined condition, and according to a result of the detection, a process of the ion implantation mode is decided.

21 Claims, 5 Drawing Sheets

ION IMPLANTATION SYSTEM WITH AN INTERLOCK FUNCTION

BACKGROUND OF THE INVENTION

1. Technical Field

The present invention relates to semiconductor fabricating devices and more specifically to an ion implantation system for a semiconductor wafer.

2. Discussion of the Related Art

In general, electrical properties of a semiconductor crystal are modified by introducing controlled amounts of dopant impurities into the semiconductor crystal. Ion implantation and diffusion are the most commonly used methods for introducing impurities into the crystals of a semiconductor wafer. In a conventional semiconductor doping technique, positive-type (P-type) impurities such as boron or $BF_2$, and negative-type (N-type) impurities such as arsenic, phosphorus and antimony are used as dopants.

Doping of semiconductor wafers by diffusion is done by introducing impurities into the semiconductor wafers and redistributing them within the semiconductor's crystals at an elevated temperature. Unlike diffusion, implanting ions is a low-temperature process in which ionized dopants are accelerated to high energies so that the dopants penetrate to a certain depth when they impact a target semiconductor wafer. Ion implantation has become one of the preferred methods for doping semiconductor wafers because of its flexibility in achieving different impurity profiles, and its ability to control the concentration of dopants.

FIG. 1 is a block diagram showing a conventional ion implantation system. The elements of the ion implantation system and/or machine (also known as an implanter) include an ion source 10, a beam transport 12, an end station 14 and a man-machine interface 16. The ion source 10 generates high-density ions, extracts a focused ion beam from the high-density ions and transfers an ion beam to a target wafer in the end station 14.

FIG. 2 is a schematic block diagram showing the beam transport 12 of FIG. 1. The beam transport 12 includes a mass analyzer 120, an accelerator 124, a focusing system 126, and a scan system 128. The mass analyzer 120 is used to select any one of several ion patterns from the ion source 10 using a strong magnetic field capable of separating ions according to a mass-to-charge ratio. After an ion beam leaves the mass analyzer 120, it is accelerated by the accelerator 124 to obtain a required kinetic energy. Next, the accelerated ion beam is focused by the focusing system 126. In order to sprinkle impurities conformally on a whole surface of a wafer 140 that is set up in the end station 14, the accelerated ion beam is absorbed horizontally or vertically by the scan system 128 located in front of the wafer 140. The scan system 128 generally includes X-scan plates 128a and Y-scan plates 128b.

The man-machine interface 16 is used by an operator to control an accelerator voltage and ion implantation system parameters equal to an ion implantation quantity. The man-machine interface 16 is also capable of displaying different system parameters, such as a beam current, on a screen to enable an operator to continuously monitor the ion implantation process. The operator may also control the ion implantation process as needed. For example, the operator may control an X-plate voltage and a Y-plate voltage by controlling a control stick (or control switches).

A mode in which the ion implantation parameters are controlled by the operator is referred to as a beam setup mode. In the beam setup mode, if all system parameters are controlled, the ion implantation system is substantially converted to an ion implantation mode where the ion beam is scanned on the wafer 140. In the ion implantation mode, ion implantation quantity, beam current, implantation time etc., are automatically controlled by a conventional dose processor. The beam setup-to-ion implantation mode conversion is performed by an operator controlling a key switch at a remote console.

While parameters are manually controlled by the operator in the beam setup mode, they are automatically controlled by the dose processor in the ion implantation mode. During the beam setup mode, there is typically a request to prevent an ion beam from being transferred to the wafer 140 in the end station 14. Unlike the beam setup mode, during the ion implantation mode, an ion beam is transferred to the wafer 140 in the end station 14. This process is typically performed by a conventional Faraday assembly. For example, the Faraday assembly prevents an ion beam from being transferred into the end station 14 during the beam setup mode, and transfers an ion beam into the end station 14 during the ion implantation mode. Before the wafer 140 is loaded in a chamber of the end station 14 in the ion implantation mode, an ion beam is absorbed to prevent the loaded wafer 140 from being damaged. In spite of the ion implantation mode conversion, which takes place according to the control of the key switch, the ion beam remains in the chamber of the end station 14. This scenario will now be described with reference to FIG. 3.

Referring to FIG. 3, a target selection circuit comprises resistors R1 and R2, and a photo coupler 18. The photo coupler 18 includes a light-emitting diode LED 22, which is a light-emitting element, and a photo transistor 24, which is a receiving element. The LED 22 generates a light 26 because a constant voltage 15V is supplied through the resistor R1. The light 26 is transferred to the photo transistor 24. The photo transistor 24 then is converted and/or switched to a conductive-state after receiving the light. As a result, an output node 28 goes to a low level. The output node 28, when at the low level, represents the beam setup mode. A relay circuit 20 is operated when a key switch KEY_SW is pushed, and thus the photo coupler 18 stops operating. That is, the photo transistor 24 of the photo coupler 18 is converted to a non-conducting state. As a result, the output node 28 goes to a high level. The output node 28, when at the high level, represents the ion implantation mode.

When the key switch KEY_SW is switched to an on-state, the ion beam is moved from the chamber of the end station 14 to a dump region by controlling one of the scan plates 128a, 128b of the beam transport 12. As a control path of the beam transport 12 is converted from the remote console to the dose processor, the ion beam is automatically moved to the dump region by the dose processor. If the constant voltage of 15V is continuously applied by inputting it to the photo coupler 18 because of inadequate contact being made by the relay circuit 20, the output node 28 is continuously at the low level thus representing the beam setup mode. In other words, the ion beam is continuously transferred to the wafer 140 when the wafer 140 is loaded in the chamber of the end station 14. As a result, there is a wafer loss. Therefore, there is a need for preventing an unnecessary ion implantation process by detecting inadequate contact of the relay circuit 20.

SUMMARY OF THE INVENTION

In accordance with one feature of the present invention, an ion implantation system comprising a scan system for scanning an ion beam on a target wafer is provided. A control unit generates one of a first control signal for controlling the scan system in a beam setup mode and a second control signal for controlling the scan system in an ion implantation mode. A selection circuit selects one of the first control signal and the second control signal. A machine interface controls the selection circuit when the ion implantation system is converted from the beam setup mode to the ion implantation mode. A detection device detects whether the machine interface satisfies a predetermined condition, and according to a result of the detection, a process of the ion implantation mode is decided.

The machine interface comprises a relay comprising a coil part and a contact part. The detection device comprises a photo coupler, wherein the photo coupler is operated according to a condition of the contact part of the relay. The machine interface satisfies the predetermined condition when the contact part of the relay is closed.

The ion implantation system further comprises a diode connected between the photo coupler and the machine interface, wherein the diode stops a current flowing from photo coupler to the machine interface. The ion implantation system also comprises a power amplifier for responding to an output of the selection circuit to supply a control voltage to the scan system.

The control unit is operated in response to an ion implantation signal, and comprises a dose processor and a remote console. The dose processor generates the first control signal to control the ion beam during the ion implantation mode. The remote console generates the second control signal to control the ion beam during the beam setup mode, and is operated by an operator. The target wafer is a semiconductor wafer.

In accordance with another feature of the present invention, an ion implantation system comprises: a scan system; a dose processor; a remote console; a selection circuit; a machine interface; a Faraday assembly; a controller and an interlock device. The scan system scans an ion beam on a target wafer. The dose processor is operated in response to an ion implantation initial signal and generates a first control signal to control the ion beam during an ion implantation mode. The remote console generates a second control signal to control the ion beam during a beam setup mode, and is manually operated. The selection circuit selects one of the first control signal and the second control signal. The machine interface controls the selection circuit according to whether an ion implantation system is converted from the ion implantation mode to the beam setup mode. The Faraday assembly stops the ion beam transmitted from the scan system during the beam setup mode and generates a down detection signal in the ion implantation mode. The controller controls the target wafer to be loaded in a chamber and generates the ion implantation initial signal in response to the down detection signal. The interlock device detects whether the machine interface satisfies a predetermined condition, and transmits the down detection signal to the controller.

The controller responds to the down detection signal to control the target wafer to be loaded in the chamber. The controller also controls the target wafer not to be loaded in the chamber and, at the same time, does not generate the ion implantation initial signal when the down detection signal is not input. The machine interface comprises a relay comprising a coil portion and a contact portion. The interlock device comprises a photo coupler, wherein the photo coupler is operated according to a condition of the contact portion of the relay. The machine interface satisfies the predetermined condition when the contact portion of the relay is closed.

The ion implantation system further comprises a diode connected between the photo coupler and the machine interface, wherein the diode stops a current flowing from the photo coupler to the machine interface. The ion implantation system also comprises a power amplifier for responding to an output of the selection circuit to supply a control voltage to the scan system. The Faraday assembly comprises a setup flag; a solenoid; and a down sensor. The setup flag prevents the ion beam supplied from the scan system during the beam setup mode from being transmitted to the chamber. The solenoid sets the setup flag in a down-state to transmit the ion beam supplied from the scan system during the ion implantation mode to the chamber. The down sensor generates the down detection signal when the setup flag is set to the down-state. The chamber is located in an end station. The target wafer is a semiconductor wafer.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 1:
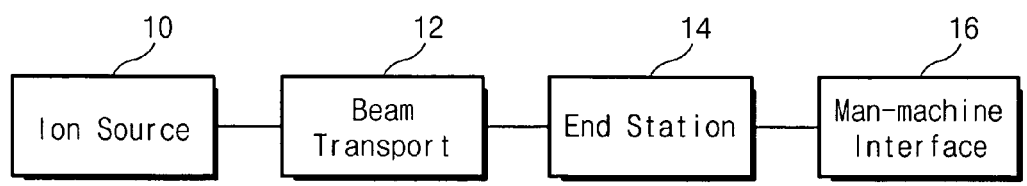
FIG. 1 is a block diagram showing a conventional ion implantation system.
Figure 2:
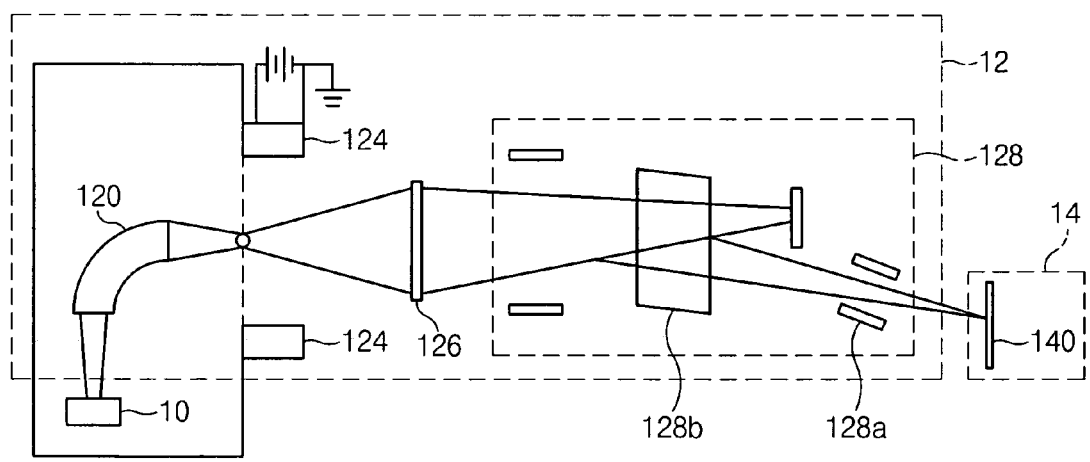
FIG. 2 is a block diagram showing a beam transport of FIG. 1.
Figure 3:
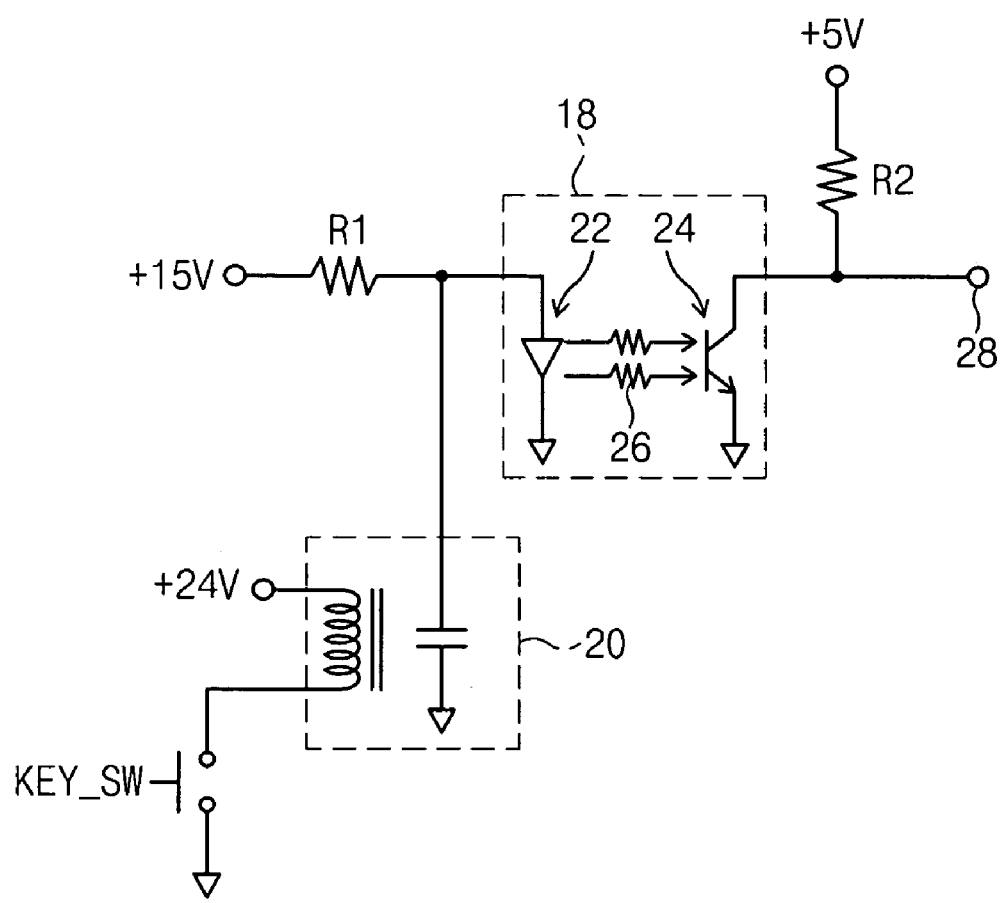
FIG. 3 is a circuit diagram showing a conventional target selection circuit and a relay circuit.
Figure 4:
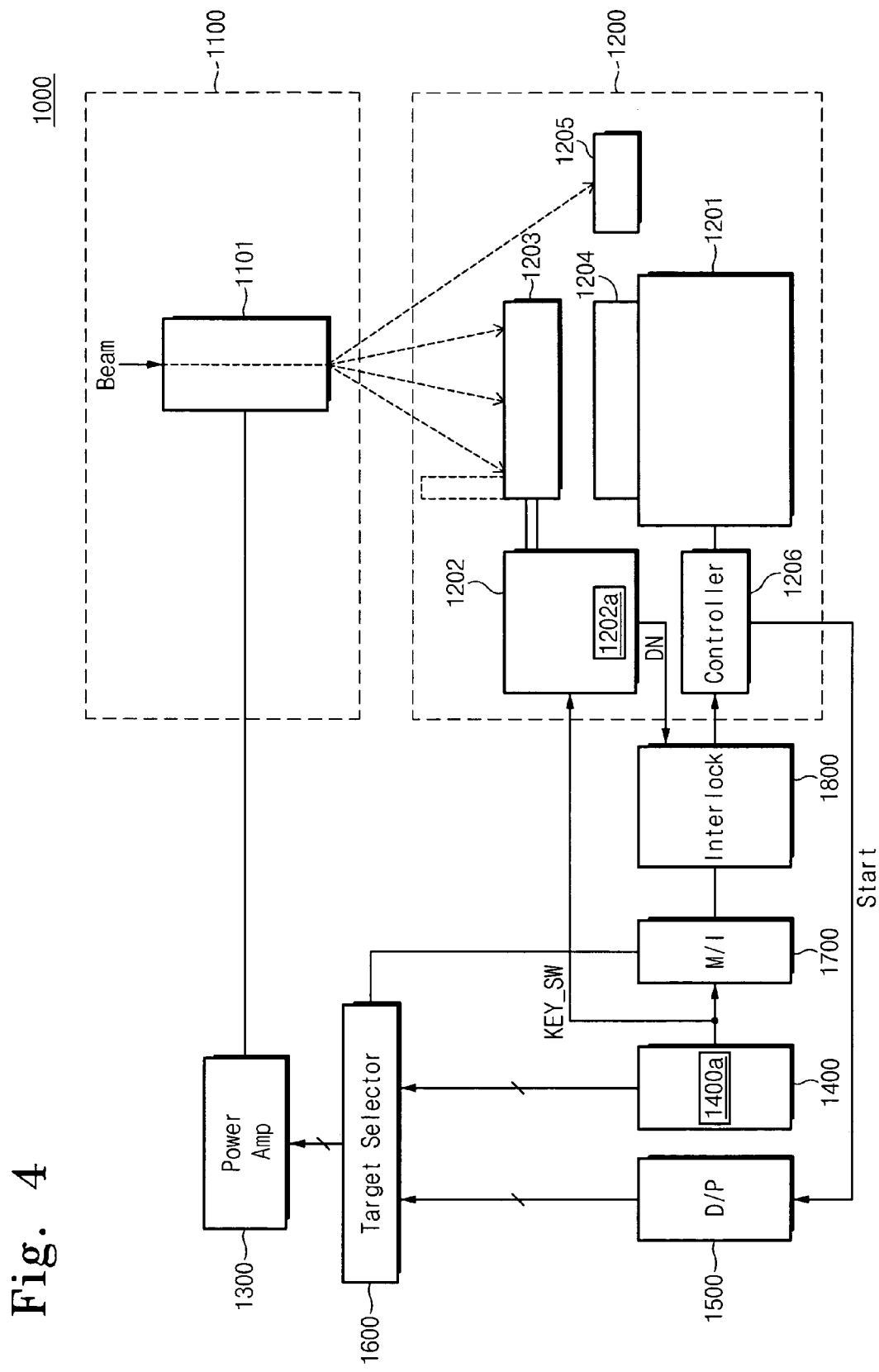
FIG. 4 is a block diagram showing an ion implantation system according to an exemplary embodiment of the present invention.

FIG. 4 is a block diagram showing an ion implantation system according to an exemplary embodiment of the present invention. Referring to FIG. 4, the ion implantation system 1000 includes a beam transport 1100. The beam transport 1100 extracts a focused ion beam from high-density ions generated from an ion source (e.g., the ion source 10 of FIG. 2) and transmits it to, for example, a semiconductor wafer in an end station 1200. The beam transport 1100 includes a scan system 1101. The scan system 1101 scans an ion beam in the direction of an X-axis and a Y-axis according to a voltage supplied from a power amplifier 1300. For convenience, only the scan system 1101 is shown in the beam transport 1100. The end station 1200 includes, inter alia, a chamber 1201, a Faraday assembly, a dump 1205, and a controller 1206. A wafer (not shown) is loaded in the chamber 1201, and the Faraday assembly prevents an ion beam transmitted from the beam transport 1100 from being transferred into the chamber 1201. If, for example, the beam setup mode is ended, the controller 1206 controls the wafer to be loaded into the chamber 1201. This will now be described in more detail.

As shown in FIG. 4, the Faraday assembly also includes a solenoid 1202, a setup flag 1203 and a Faraday 1204. The solenoid 1202 controls the setup flag 1203 in a down-state and is responsive to a key switch signal KEY_SW of a remote console 1400. When the setup flag 1203 is in an up-state, an ion beam from the beam transport 1100 is cut, and is not transferred through the setup flag 1203 into the chamber 1201. If the setup flag 1203 is in the down-state, an ion beam from the beam transport 1100 is transferred into the chamber 1201. An exemplary Faraday assembly is disclosed in Korean Laid-Open Publication No. 2002-12858 entitled "ION IMPLANTATION DEVICE", and U.S. Pat. No. 4,751,393 entitled "DOSE MEASUREMENT AND UNIFORMITY MONITORING SYSTEM FOR ION IMPLANTATION", both of which are herein incorporated by reference. Accordingly, the description, of the Faraday assembly will not be discussed hereinafter. The solenoid 1202 sets the setup flag 1203 in the down-state in response to the key switch signal KEY_SW output from the remote console 1400. The solenoid 1202 includes a down sensor 1202a. The down sensor 1202a senses whether the setup flag 1203 is in the down-state, which is illustrated by the dashed lines in FIG. 4, and thereby outputs a down sense signal DN.

In the embodiment of FIG. 4, the scan system 1101 transfers the ion beam to the setup flag 1203 depending on a control voltage of the power amplifier 1300 when in the beam setup mode. The scan system 1101 transfers the ion beam to the dump 1205 when in the ion implantation mode depending on the control voltage of the power amplifier 1300. The power amplifier 1300 is automatically controlled by a dose processor in the ion implantation mode, but may also be manually controlled by an operator through the remote console 1400 when in the beam setup mode. This will now be described in more detail.

Referring to FIG. 4, the remote console 1400, which is operated by the operator, generates various control signals for controlling the power amplifier 1300 by using an operating mechanism. As such, the remote console 1400 includes a key switch 1400a and is controlled by the operator when the beam setup mode is converted and/or switched to the ion implantation mode. Although not shown in FIG. 4, the remote console 1400 also includes various buttons for controlling beam parameters. When the key switch 1400a goes in an off-to-on conversion, the key switch signal KEY_SW is at a ground voltage level. A dose processor 1500 detects whether an ion implantation initial signal START is output from the end station 1200. If the ion implantation initial signal START is detected, the dose processor 1500 automatically generates various control signals for controlling the power amplifier 1300.

A target selection circuit 1600 selects control signals output from the remote console 1400 when in the beam setup mode. In the ion implantation mode, the target selection circuit 1600 selects control signals output from the dose processor 1500. A machine interface 1700 selects output signals of the remote console 1400 or the dose processor 1500 by responding to the key switch signal KEY_SW output from the remote console 1400.

If the key switch 1400a is converted to the on-state, the machine interface 1700 may not operate normally. As a result, the target selection circuit 1600 continuously selects the output signals of the remote console 1400. Thus, as previously mentioned, in the beam setup-to-ion implantation mode conversion, the ion beam is moved to the dump 1205. The ion beam's movement is automatically performed by the dose processor 1500 in the ion implantation mode. As a result, if the machine interface 1700 is not operating normally, the ion beam remains in the chamber 1201.

An interlock device 1800 detects whether the machine interface 1700 is operating normally. In other words, the interlock device 1800 detects whether the machine interface 1700 satisfies a predetermined condition. The interlock device 1800 also transfers a down sense signal DN output from the down sensor 1202a to the controller 1206 of the end station 1200, according to a result of the detection. The controller 1206 controls the wafer to be loaded in the chamber 1201 in response to the input of the down sense signal DN. At the same time, the controller 1206 outputs the ion implantation initial signal START to the dose processor 1500.

Figure 5:
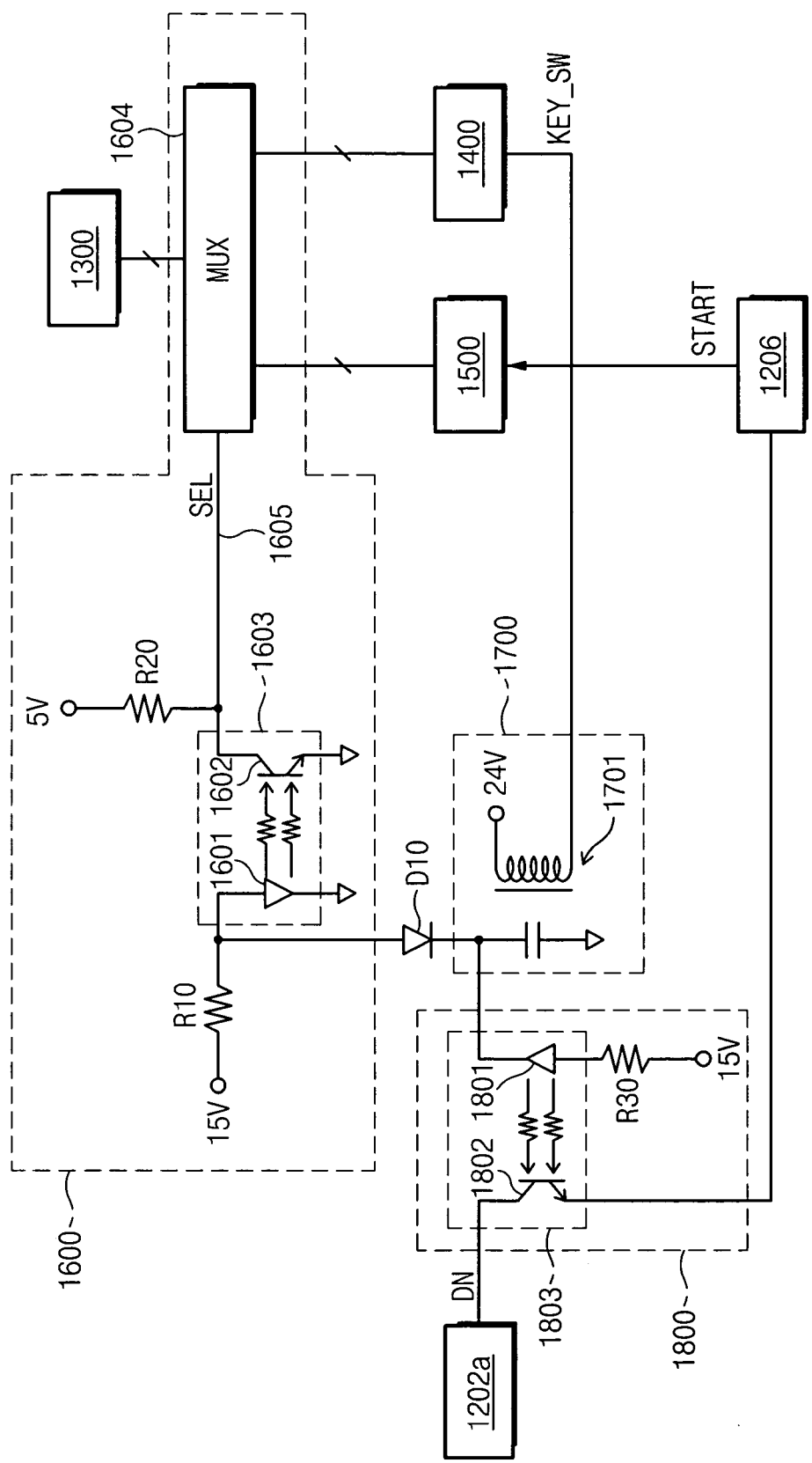
FIG. 5 is a circuit diagram showing a target selection circuit, a machine interface and an interlock device of FIG. 4 according to an exemplary embodiment of the present invention.

FIG. 5 is a circuit diagram showing the target selection circuit 1600, the machine interface 1700 and the interlock device 1800 of FIG. 4 according to an exemplary embodiment of the present invention.

Referring to FIG. 5, the target selection circuit 1600 includes resistors R10 and R20, a photo coupler 1603 and a multiplexer MUX 1604. The photo coupler 1603 comprises a light-emitting diode LED 1601, which is a light-emitting element, and a photo transistor 1602, which is a light-receiving element. The light-emitting diode 1601 generates a light because a constant voltage 15V is supplied through the resistor R10, and this light is transferred to the photo transistor 1602. Then, the photo transistor 1602 is converted to a conductive-state by the input light. In other words, a selection signal SEL goes to a low level. The selection signal SEL at the low level represents the beam setup mode.

A signal line 1605 is connected through the photo transistor 1602 to the constant voltage 15V. The signal line 1605 has a high level when the photo transistor 1602 is a non-conductive state. This represents the ion implantation mode. The multiplexer MUX 1604 selects output signals of the remote console 1400 or the dose processor 1500 in response to the selection signal SEL. For example, if the selection signal SEL is at the low level (that is, in the beam setup mode), the multiplexer MUX 1604 selects an output signal of the remote console 1400. The selected signals are transferred to the power amplifier 1300. If the selection signal SEL is at the high level (that is, in the ion implantation mode), the multiplexer MUX 1604 selects output signals of the dose processor 1500. The selected signals are transferred to the power amplifier 1300.

Referring to FIG. 5, the machine interface 1700 includes a relay 1701 having by a coil part and a contact part. If the key switch signal KEY_SW output from the remote console 1400 has the ground voltage at the low level, a current path is formed between a constant voltage 24V of the machine interface 1700 and the key switch signal KEY_SW. At this time, a contact of the contact part is closed according to a magnetic field generated by the coil part. In other words, the relay 1701 is operating normally. In this case, because a discharge path is formed by the relay 1701, the contact voltage 15V is not transferred to the photo coupler 1603. As a result, the light-emitting diode LED 1601 of the photo coupler 1603 stops generating light, so that the selection signal SEL can go to the high level. The relay 1701 is operated only if the key switch signal KEY_SW is turned on. Accordingly, the photo coupler 1603 stops operating.

The interlock device 1800 detects whether the relay 1701 of the machine interface 1700 is operating normally. The interlock device 1800 selectively transfers the down sense signal DN to the controller 1206. The down sense signal DN is output from the down sensor 1202a of the end station 1200, according to the detection result. The interlock device 1800 includes a resistor R30 and a photo coupler 1803. The photo coupler 1803 comprises a light-emitting diode LED 1801, which is a light-emitting element, and a photo transistor 1802, which is a light-receiving element. The light-emitting diode 1801 generates light when a current path is formed between the constant voltage 15V and the relay 1701 (or when a contact of the relay is normally closed). This light is transferred to the photo transistor 1802. The photo transistor 1802 is converted in a conductive-state by the input light. As the photo transistor 1802 is converted, the down sense signal DN output from the down sensor 1202a of the end station 1200 is transferred through the photo transistor 1802 of the interlock device 1800 to a controller 1206 of the end station 1200. If a contact of the relay 1701 is not normally closed, irrespective of a normal conversion of the key switch signal KEY_SW, the photo coupler 1803 senses this and prevents the down sense signal DN from being transferred to the controller 1206 of the end station 1200.

The operation of the ion implantation system according to the present invention will now be described referring to FIGS. 4 and 5.

In the beam setup mode, a conventional ion source generates high-density ions, and the beam transport 1100 extracts the focused ion beam from the high-density ions and transfers it to the end station 1200. Thus, the setup flag 1203 goes to the up-state when in the beam setup mode. When the setup flag 1203 is in the up-state, the ion beam output from the beam transport 1100 is not transferred into the chamber 1201. Because the key switch 1400a remains in the off-state when in the beam setup mode, the relay 1701 is not operated. In addition, when the photo transistor 1602 is converted to a conductive-state by the input light of the target selection circuit 1600, the relay 1701 is not operated. Thus, the selection signal SEL goes to the low level, which represents the beam setup mode. As a result, the output signals of the remote console 1400 are transferred through the multiplexer MUX 1604 to the power amplifier 1300. Under this condition, the ion beam may be controlled by the operator.

When the ion beam is generated, the operator switches the key switch 1400a of the remote console 1400 to the on-state. At this time, the key switch signal KEY_SW has the ground voltage level at the low level. In other words, the constant voltage 15V stops being supplied to the photo coupler 1603. Accordingly, the selection signal SEL goes to a high level, and the multiplexer MUX 1604 transfers the output signals of the dose processor 1500 to the power amplifier 1300. As the key switch signal KEY_SW is generated, the solenoid 1202 converts the setup flag to the up-to-down state. If the setup flag 1203 goes into the up-to-down state conversion, the down sensor 1202a generates the down sense signal DN.

If the relay 1701 is operating normally, the interlock device 1800 transfers the down sense signal DN of the down sensor 1202a to the controller 1206. If the down sense signal DN is input, the controller 1206 controls the wafer to be loaded in the chamber 1201. Next, the controller 1206 sends the ion implantation initial signal START to the dose controller 1500. The dose controller 1500 then generates control signals for controlling the power amplifier 1300 in response to the ion implantation initial signal START. The control signals are transferred through the multiplexer MUX 1604 to the power amplifier 1300. Then, according to a conventional method, the ion beam may be scanned onto the wafer.

When an inadequate contact arises in the relay 1701, even if the key switch signal KEY_SW has the ground voltage level at the low level, the constant voltage 15V is continuously supplied to the photo coupler 1603. Thus, the selection signal SEL remains at the low level when in the ion implantation mode. Accordingly, the multiplexer MUX 1604 continuously selects output signals of the remote console 1400. At the same time, the interlock device 1800 detects whether the relay 1701 is operating normally. The interlock device 1800 cuts a transmission path of the down sense signal DN according to the detected result. As previously mentioned, when the key switch 1400a is switched to the on-state, the solenoid 1202 converts the setup flag 1203 to the up-to-down state. The down sensor 1202a senses the down-state of the setup flag 1203 to generate the down sense signal DN.

Although the down sense signal DN is generated, the down sense signal DN stops being transferred by the interlock device 1800. Because the down sense signal DN is not transferred to the controller 1206 in the ion implantation mode, the controller 1206 prevents the wafer from being loaded. As a result, and in spite of the beam setup-to-the ion implantation mode conversion, an ion implantation process is not performed. The operator may then directly sense this state or the state may be sensed through an alarm indication (not shown).

Figure 6:
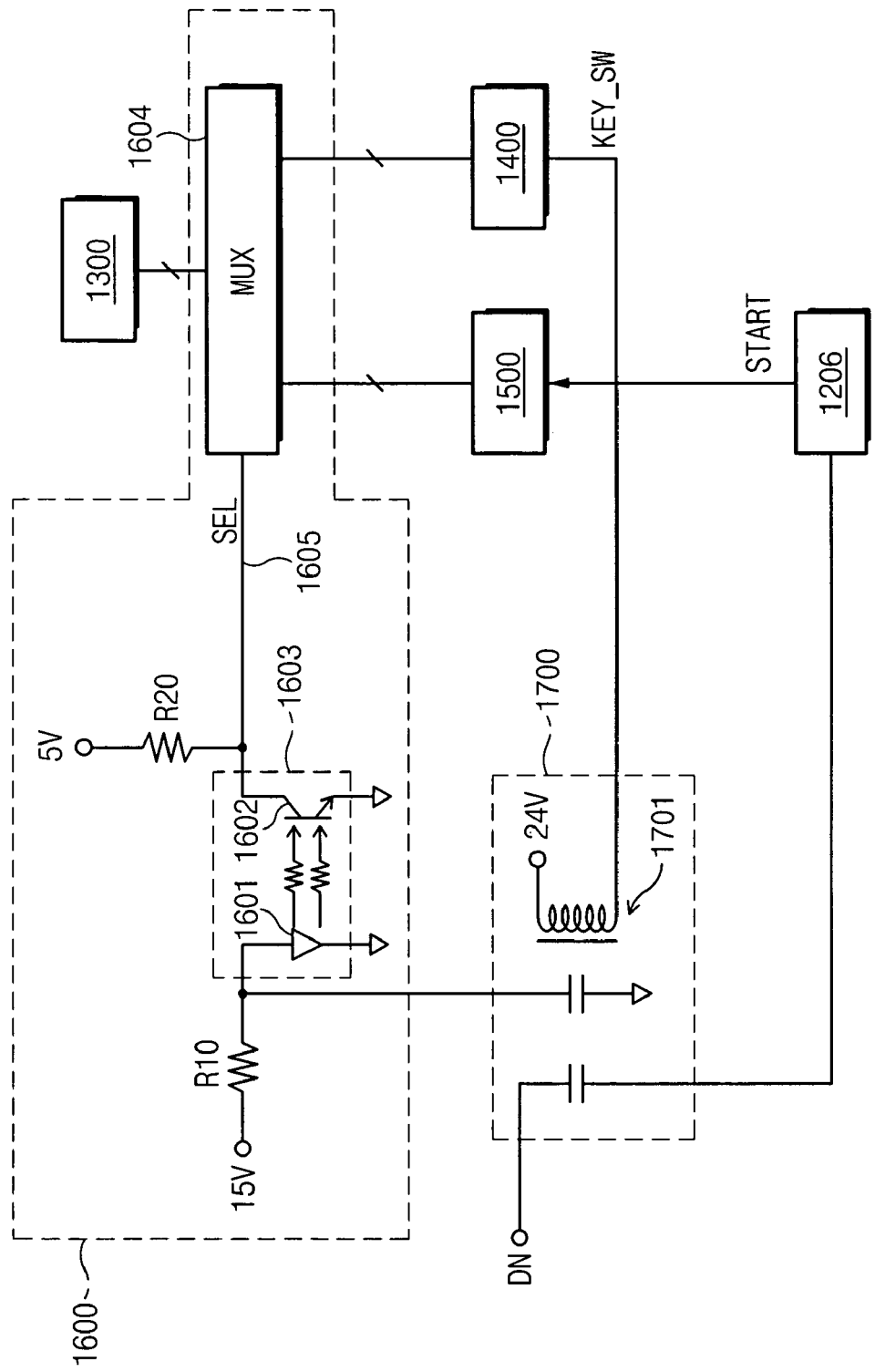
FIG. 6 is a circuit diagram showing the target selection circuit and the machine interface of FIG. 4 according to another exemplary embodiment of the present invention.

As shown in FIG. 6, by employing an idle contact of the relay 1701 rather than of the interlock device 1800, the down sense signal DN may be transferred to the controller 1206 of the end station 1200. In other words, when a magnetic field is generated in the coil part of the relay 1701, if the contacts are normally closed, the selection signal SEL is transitioned from the low level to the high level, and the down sense signal DN may be transferred through the relay 1701 to the controller 1206 of the end station 1200. It will be readily apparent to one of ordinary skill in the art that the ion implantation system as described in FIG. 6 is operated similar to that as shown in FIG. 5, and will not be described hereinafter.

In accordance with the present invention, an ion implantation system capable of preventing wafer loss depending on the inadequate contact of a relay is provided. In addition, the present invention enables the inadequate contact of a relay, which is used for controlling a beam setup-to-ion beam mode conversion, to be precisely sensed.

In an alternative embodiment of the present invention, the ion implantation system may employ more than one end station.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An ion implantation system comprising a scan system for scanning an ion beam on a target wafer, comprising:
   a control unit for generating one of a first control signal to control the scan system in a beam setup mode and a second control signal to control the scan system in an ion implantation mode;
   a selection circuit for selecting one of the first control signal and the second control signal;
   a machine interface for controlling the selection circuit according to whether the ion implantation system is converted from the beam setup mode to the ion implantation mode; and
   a detection device for detecting whether the machine interface satisfies a predetermined condition, wherein according to a result of the detection, a process of the ion implantation mode is decided.

2. The ion implantation system of claim 1, wherein the machine interface comprises:

a relay comprising a coil part and a contact part.

3. The ion implantation system of claim 2, wherein the machine interface satisfies the predetermined condition when the contact part of the relay is closed.

4. The ion implantation system of claim 2, wherein the detection device comprises:

a photo coupler, wherein the photo coupler is operated according to a condition of the contact part of the relay.

5. The ion implantation system of claim 4, further comprising:

a diode connected between the photo coupler and the machine interface, wherein the diode stops a current flowing from the photo coupler to the machine interface.

6. The ion implantation system of claim 1, further comprising:

a power amplifier for responding an output of the selection circuit to supply a control power to the scan system.

7. The ion implantation system of claim 1, wherein the control unit comprises:

a dose processor operated in response to an ion implantation initial signal and for generating the first control signal to control the ion beam during the ion implantation mode; and a remote console for generating the second control signal to control the ion beam during the beam setup mode.

8. The ion implantation system of claim 7, wherein the remote console is operated by an operator.

9. The ion implantation system of claim 1, wherein the target wafer is a semiconductor wafer.

10. An ion implantation system comprising a scan system for scanning an ion beam on a target wafer, comprising:

a dose processor operated in response to an ion implantation initial signal and for generating a first control signal to control the ion beam during an ion implantation mode;

a remote console for generating a second control signal to control the, ion beam during a beam setup mode;

a selection circuit for selecting one of the first control signal and the second control signal;

a machine interface for controlling the selection circuit according to whether the ion implantation system is converted from the beam setup mode to the ion implantation mode;

a Faraday assembler for stopping an ion beam transmitted from the scan system during the beam setup mode and for generating a down detection signal in the ion implantation mode;

a controller for controlling the target wafer to be loaded in a chamber and for generating the ion implantation initial signal in response to the down detection signal; and an interlock device for detecting whether the machine interface satisfies a predetermined condition and for providing the down detection signal to the controller according to a result of the detection.

11. The ion implantation system of claim 10, wherein the controller loads the target wafer into the chamber in response to an input of the down detection signal.

12. The ion implantation system of claim 11, wherein the controller does not load the target wafer into the chamber when the down detection signal is not input, and does not generate the ion implantation initial signal.

13. The ion implantation system of claim 10, wherein the machine interface comprises:

a relay comprising a coil portion and a contact portion.

14. The ion implantation system of claim 13, wherein the machine interface satisfies the predetermined condition when the contact portion of the relay is closed.

15. The ion implantation system of claim 13, wherein the interlock device comprises:

a photo coupler, wherein the photo coupler is operated according to a condition of the contact portion of the relay.

16. The ion implantation system of claim 15, further comprising:

a diode connected between the photo coupler and the machine interface, wherein the diode stops a current flowing from the photo coupler to the machine interface.

17. The ion implantation system of claim 10, further comprising:

a power amplifier for responding to an output of the selection circuit to supply a control voltage to the scan system.

18. The ion implantation system of claim 10, wherein the Faraday assembler comprises:

a setup flag for preventing an ion beam supplied by the scan system during the beam setup mode from being transferred to the chamber;

a solenoid for setting the setup flag in a down-state to transfer an ion beam that is supplied from the scan system during the ion implantation mode to the chamber; and a down sensor for generating the down detection signal when the setup flag is set in the down-state.

19. The ion implantation system of claim 10, wherein the chamber is located an end station.

20. The ion implantation system of claim 10, wherein the remote console is manually operated.

21. The ion implantation system of claim 10, wherein the target wafer is a semiconductor wafer.

* * * * *